(12) United States Patent
Chai

(10) Patent No.: US 9,210,797 B2
(45) Date of Patent: Dec. 8, 2015

(54) ARRAY SUBSTRATE, MANUFACTURING METHOD THEREOF, AND FLAT PANEL DISPLAY DEVICE

(71) Applicant: Shenzhen China Star Optoelectronics Technology Co., Ltd., Shenzhen, Guangdong (CN)

(72) Inventor: Li Chai, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 119 days.

(21) Appl. No.: 13/985,285

(22) PCT Filed: Jul. 1, 2013

(86) PCT No.: PCT/CN2013/078559
§ 371 (c)(1),
(2) Date: Aug. 13, 2013

(87) PCT Pub. No.: WO2014/205858
PCT Pub. Date: Dec. 31, 2014

(65) Prior Publication Data
US 2014/0374140 A1 Dec. 25, 2014

(30) Foreign Application Priority Data
Jun. 24, 2013 (CN) .......................... 2013 1 02537346

(51) Int. Cl.
*G02F 1/1343* (2006.01)
*H05K 1/02* (2006.01)
*G02F 1/1345* (2006.01)
*G02F 1/1362* (2006.01)

(52) U.S. Cl.
CPC ............ *H05K 1/0213* (2013.01); *G02F 1/1345* (2013.01); *G02F 2001/13629* (2013.01); *H05K 2201/0338* (2013.01); *H05K 2201/0784* (2013.01)

(58) Field of Classification Search
CPC ............ H05K 1/0213; H01J 9/00; H01J 9/26; H01L 21/77; H01L 21/4763; H01L 23/48; H01L 27/12; H01L 27/13; H01L 29/786; H01L 33/08; H03K 19/0175; G02F 1/136; G02F 1/1343; G02F 1/1345; G02F 1/133512
USPC ............ 174/250; 427/971; 349/42, 110, 139, 349/149; 326/82; 257/52, 59, 66, 91, 741, 257/773, 776, E23.168, E21.597, E27.016, 257/E27.112, E27.113, E29.288, E33.066; 438/620; 445/24, 25
See application file for complete search history.

(56) References Cited

U.S. PATENT DOCUMENTS 6,686,651 B1 * 2/2004 Foster .......................... 257/666
2007/0039706 A1 * 2/2007 Chen et al. .................... 162/301
(Continued)

FOREIGN PATENT DOCUMENTS

CN     1743927 A    *  3/2006

*Primary Examiner* — Timothy Thompson
*Assistant Examiner* — Guillermo Egoavil
(74) *Attorney, Agent, or Firm* — Andrew C. Cheng

(57) ABSTRACT

Any one of the fan-out leads includes a first metal strip portion having a predetermined number, located on a glass substrate, disposed along an extension direction of the fan-out lead and is spaced apart; an insulation layer covering each of the first metal strip portion, and disposed with a first through hole and a second through hole; and a second metal strip portion located on the insulation layer and being contacted with each of the first metal strip portion by the first through hole and the second through hole. Wherein, the lengths of the first metal strip portions of the fan-out leads are gradually increased along the direction which is from the center to the edge of the fan shape such that impedances of the fan-out leads are consistent.

8 Claims, 3 Drawing Sheets

(56) References Cited

U.S. PATENT DOCUMENTS

| | | | |
|---|---|---|---|
| 2007/0052895 A1* | 3/2007 | Chen | 349/139 |
| 2008/0137016 A1* | 6/2008 | Kim et al. | 349/139 |
| 2013/0234329 A1* | 9/2013 | Bezama | H01L 21/76804 257/738 |

* cited by examiner

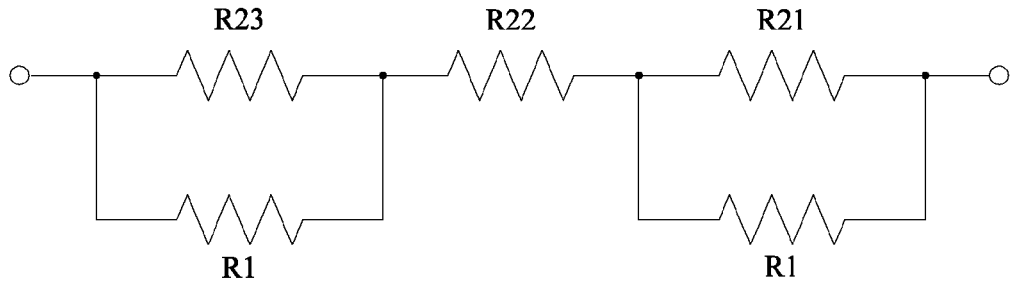

FIG. 5

| forming a first metal layer on a glass substrate and manufacturing the first metal layer into multiple first metal lines distributed as a fan shape, wherein each of the first metal lines includes a first metal strip portion having a predetermined number, and each of the first metal strip portion is spaced apart; lengths of the first metal strip portions of the multiple first metal lines are increased along a direction which is from a center to an edge of the fan shape and the predetermined numbers are decreased along the direction. | ~S31 |

↓

| forming an insulation layer on the multiple first metal lines and providing with a first through hole and a second through hole at a location of the insulation layer covering on each of the first metal strip portion. | ~S32 |

↓

| forming a second metal layer on the insulation layer and manufacturing the second metal layer into multiple second metal strip portions, wherein each of the second metal strip portions contacts with each of the first metal strip portion by the first through hole and the second through hole; a length of the second metal strip portion is greater than or equal to a length of the first metal strip portion. | ~S33 |

FIG. 6

ARRAY SUBSTRATE, MANUFACTURING METHOD THEREOF, AND FLAT PANEL DISPLAY DEVICE

BACKGROUND OF THE INVENTION

1. Field of the Invention

The present invention relates to the field of flat panel display technology, in particular to an array substrate, a manufacturing method thereof, and a flat panel display device.

2. Description of Related Art

People have increasing demand for display devices so that flat panel display can be widely popular, and the LCD (Liquid Crystal Display) and the OLED (Organic Light-Emitting Diode) industries are rapidly developing.

The array substrate is an important element of the display panel, which has an effective display region (referred to AA region, Active Region) and a non-effective display region surrounded the effective display region, the effective display region includes signal lines, scan lines and data lines. The non-effective region includes fan-out leads distributed as a fan shape. The signal lines connect correspondingly to the fan-out leads, and connect to the periphery chip through the fan-out leads. Since the length of each fan-out lead is not equal, if the width of each fan-out leads case is equal, the impedances of the fan-out leads at the central portion of the fan shape are lower than the impedances of the fan-out leads at the edge portion of the fan shape. Therefore, when sending a signal to the signal lines, the signal outputted by the chip cannot keep synchronization so as to cause the display unevenness.

Please refer to FIG. 1 and FIG. 2 together. FIG. 1 is a schematic drawing of the fan-out leads in the prior art. In FIG. 1, it only schematically illustrates three fan-out leads. The fan-out lead 11, fan-out lead 12, and fan-out lead 13 are distributed as a fan shape. The fan-out lead 12 is located at the center of the fan shape, and the fan-out leads 11 and 13 are located at the edges of the fan shape. The lengths of the fan-out lead 11 and the fan-out lead 13 are equal. The fan-out lead 12 utilizes a bending winding way to increase the effective length such that its length is consistent with the lengths of the fan-out lead 11 and the fan-out lead 13. FIG. 2 is a cross-sectional view of the fan-out leads 12 shown in FIG. 1 at the A-A' direction.

The fan-out lead 12 is obtained by sequentially stacking a first metal layer 121, an insulation layer 122, a second metal layer 123 and a passivation layer 124 and by using the array process. Since the first metal layer 121 and the second metal layer 123 are insulated from each other, when inputting a signal, the first metal layer 121 and the second metal layer 123 are equivalent to two resistors connected in parallel. The fan-out lead 11 and the fan-out lead 13 have the same internal structures with the fan-out lead 12.

Because each of the fan-out leads has the same structure, and their lengths are also the same, the fan-out lead 11, the fan-out leads 12 and the fan-out lead 13 have equal impedance. However, because the limitation of the conventional art and process, the winding portion of the fan-out lead 12 is relatively sparse such that the height of the fan-out lead 12 is increased, and the area occupied by the non-effective display region is increased. Therefore, it is not conducive for the narrow frame design of the display panel, and reduces the utilization rate of the array substrate.

SUMMARY OF THE INVENTION

The main object of the present invention is to provide an array substrate and a manufacturing method thereof, and a flat panel display device so as to keep impendences of fan-out leads to be consistent under the lengths of the fan-out leads are not equal.

In order to solve the above technical problems, a technical solution provided by the present invention is: an array substrate comprising an effective display region; and a non-effective display region surrounding the effective display region and having multiple fan-out leads distributed as a fan shape, wherein, each fan-out lead has a predetermined length, and the predetermined lengths of the multiple fan-out leads are increased along a direction which is from a center to an edge of the fan shape, wherein, any one of the fan-out leads comprises: a first metal strip portion having a predetermined number and located on a glass substrate, wherein, the first metal strip portion having the predetermined, number disposed along an extension direction of the fan-out lead and is spaced apart, and a length of each of the first metal strip portion is less than or equal to the predetermined length; an insulation layer covering each of the first metal, strip portion, and a location of the insulation layer which is covering each of the first metal strip portion is disposed with a first through hole and a second through hole; and a second metal strip portion located on the insulation layer and being contacted with each of the first metal strip portion by the first through hole and the second through hole, wherein, a length of the second metal strip portion is equal to the predetermined length; wherein, the lengths of the first metal strip portions of the fan-out leads are gradually increased along the direction which is from the center to the edge of the fan shape and the predetermined numbers of the first metal strip portions are gradually decreased along the direction such that impedances of the fan-out leads are consistent.

Wherein, any one of the fan-out leads comprises a passivation layer covering the second metal strip portion.

Wherein, the length of each of the first metal strip portion is equal.

Wherein, a distance between each of the first metal strip portion is equal.

Wherein, a line width of each of the fan-out leads is equal.

In order to solve the above technical problems, another technical solution provided by the present invention is: a manufacturing method for an array substrate comprising: forming a first metal layer on a glass substrate and manufacturing the first metal layer into multiple first metal lines distributed as a fan shape, wherein each of the first metal lines includes a first metal strip portion having a predetermined number, and each of the first metal strip portion is spaced apart; lengths of the first metal strip portions of the multiple first metal lines are increased along a direction which is from a center to an edge of the fan shape and the predetermined numbers are decreased along the direction; forming an insulation layer on the multiple first metal lines and providing with a first through hole and a second through hole at a location of the insulation layer covering on each of the first metal strip portion; and forming a second metal layer on the insulation layer and manufacturing the second metal layer into multiple second metal strip portions, wherein each of the second metal strip portions contacts with each of the first metal strip portion by the first through hole and the second through hole; a length of the second metal strip portion is greater than or equal to a length of the first metal strip portion.

Wherein, the method further comprises: forming a passivation layer on the multiple second metal strip portions.

Wherein, the length of each of the first metal strip portion of each metal line is equal.

Wherein, a distance between each of the first metal strip portion is equal.

In order to solve the above technical problems, another technical solution provided by the present invention is: A flat panel display device comprising an array substrate, wherein the array substrate comprises: an effective display region; and a non-effective display region surrounding the effective display region and having multiple fan-out leads distributed as a fan shape, wherein, each fan-out lead has a predetermined length, and the predetermined lengths of the multiple fan-out leads are increased along a direction which is from a center to an edge of the fan shape, wherein, any one of the fan-out leads comprises: a first metal strip portion having a predetermined number and located, on a glass substrate, wherein, the first metal strip portion having the predetermined number disposed along an extension direction of the fan-out lead and is spaced apart, and a length of each of the first metal strip portion is less than or equal to the predetermined length; an insulation layer covering each of the first metal strip portion, and a location of the insulation layer which is covering each of the first metal strip portion is disposed with a first through hole and a second through hole; and a second metal strip portion located on the insulation layer and being contacted with each of the first metal strip portion by the first through hole and the second through hole, wherein, a length of the second metal strip portion is equal to the predetermined length; wherein, the lengths of the first metal strip portions of the fan-out leads are gradually increased along the direction which is from the center to the edge of the fan shape and the predetermined numbers of the first metal strip portions are gradually decreased along the direction such that impedances of the fan-out leads are consistent.

Wherein, any one of the fan-out leads comprises a passivation layer covering the second metal strip portion.

Wherein, the length of each of the first metal strip portion is equal.

Wherein, a distance between each of the first metal strip portion is equal.

Wherein, a line width of each of the fan-out leads is equal.

In summary, the array substrate, the manufacturing method for the array substrate, and the flat panel display device of the present invention provides with a first through hole and a second through hole at a location of the insulation layer which covers each of the first metal strip portion such that the second metal strip portion contacts with each of first metal strip portion by the first through hole and the second through hole. By adjusting the length of the first metal strip portion of each fan-out lead, it can keep impendences of the fan-out leads to be consistent under the lengths of the fan-out leads are not equal so as to decrease the heights of the fan-out leads, increase the utilization of the array substrate, and be beneficial for the narrow frame design of the display panel.

BRIEF DESCRIPTION OF THE DRAWINGS

FIG. 5 is schematic drawing of equivalent circuit of the fan-out leads shown in FIG. 4; and FIG. 6 is a flowchart of a manufacturing method for an array substrate according to the present invention.

DETAILED DESCRIPTION OF THE PREFERRED EMBODIMENT

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

Figure 3:
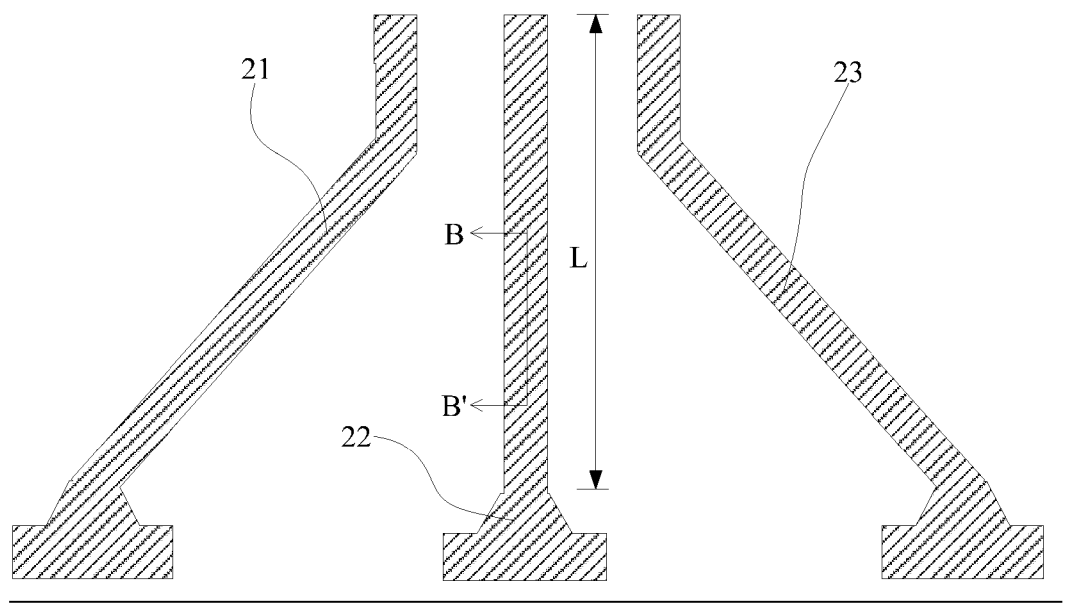
FIG. 3 is schematic drawing of fan-out leads at the non-effective region on an array substrate according to an embodiment of the present invention.

With reference to FIG. 3, it is schematic drawing of fan-out leads at the non-effective region on an array substrate according to an embodiment of the present invention.

The array substrate comprises an effective display region and a non-effective display region. The non-effective display region surrounds the effective display region. The effective display region includes signal lines, and the non-effective display region includes multiple fan-out leads distributed as a fan shape. The signal lines correspondingly connect to the fan-out leads for receiving an external input signal. Each fan-out lead has a predetermined length, the predetermined length of the multiple fan-out leads are gradually increased along a direction which is from a center to an edge of the fan shape. In this embodiment, a line width of each fan-out lead is equal. It should be understood that it only schematically illustrates three fan-out leads 21, 22 and 23, but it is not used for limiting the number of the fan-out leads. The fan-out lead 22 is located at the center of the fan shape, and the fan-out leads 21, 23 are located at the edges of the fan shape.

In the three fan-out leads 21, 22 and 23, each of them has a predetermined length. The predetermined length L of the fan-out lead 22 is less than the predetermined lengths of the fan-out lead 21 and the fan-out lead 23. Please also refer to FIG. 4, and it is a cross-sectional view of the B-B' direction shown in FIG. 3. The fan-out lead 22 includes a first metal strip portion 221, an insulation layer 222 and a second metal strip portion 221.

The first metal strip portion 221 has a predetermined number and located on a glass substrate (not shown). The first metal strip portion 221 having the predetermined number is disposed along an extension direction of the fan-out lead 22 and is spaced apart. A length d of each first metal strip portion 221 is less than or equal to the predetermined length L. Because the predetermined length L of the fan-out lead 22 has limitation, when the length d of the first metal strip portion 221 is closer to the predetermined length L, the predetermined number is smaller. It can be understood that if the length d of the first metal strip portion 221 is equal to the predetermined length L, the predetermined number of the first metal strip portion 221 is one. In this embodiment, the length d of each of the first metal strip portion 221 is equal. Furthermore, a distance between each of the first metal strip portion 221 is equal.

The insulation layer 222 covers each of the first metal strip portion 221. A location of the insulation layer 222 which covers each of the first metal strip portion 221 is disposed with a first through hole 2221 and a second through hole 2222. Between the two first metal strip portions 221, the insulation layer 222 also covers the glass substrate.

A second metal strip portion 223 is located on the insulation layer 222. The second metal strip portion 223 contacts with each of the first metal strip portion 221 by the first through hole 2221 and the second through hole 2222. A length of the second metal strip portion 223 is equal to the predetermined length L.

The internal structures of the fan-out lead 22 and the fan-out leads 21 and 23 are the same. The difference is that a length of the first metal strip portion of the fan-out lead 21 and the fan-out lead 23 is longer than the length d of the first metal strip portion 221 of the fan-out lead 22. The fan-out lead 21, the fan-out lead 22, and the fan-out lead 23 use the insulation layer 222 commonly. For the number of the fan-out leads which is more than three, the lengths of the first metal strip portions of the fan-out leads are gradually increased along a direction which is from a center to an edge of the fan shape and the predetermined numbers are gradually decreased along the direction such that an impedance of each fan-out lead is consistent.

In another embodiment, the fan-out lead 22 also includes a passivation layer 224. The passivation layer 224 covers the second metal strip portion 223 so as to enhance abrasion and corrosion resistance for the second metal strip portion.

Figure 1:
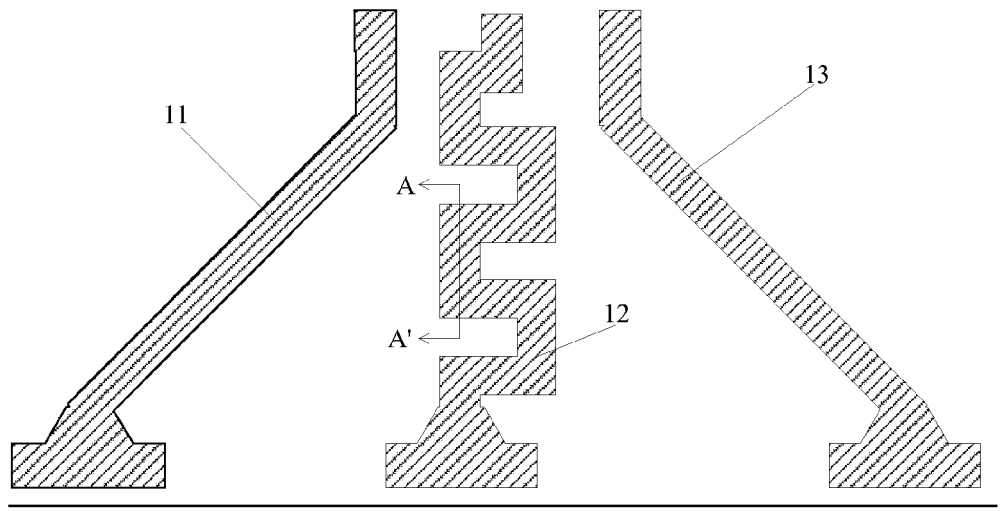
FIG. 1 is a schematic drawing of the fan-out leads in the prior art.
Figure 2:
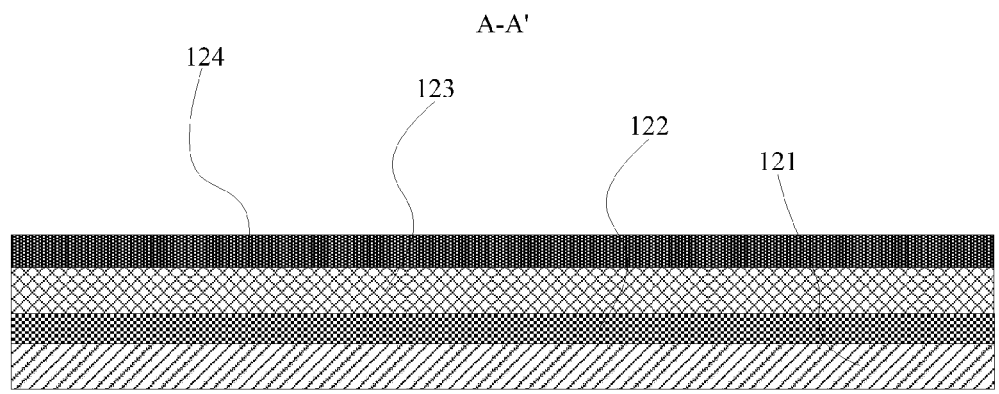
FIG. 2 is a cross-sectional view at the A-A' direction of the fan-out lead 12 shown in FIG. 1.

Please refer to FIG. 2 and FIG. 5. FIG. 5 is a schematic drawing of an equivalent circuit of the fan-out leads shown in FIG. 4. There are two first metal strip portions 221 in FIG. 4, and the two portions 221 correspond two impedances R1 in FIG. 5. Each of first metal strip portions 221 contacts with the second the metal strip portion 223 by the first through hole 2221 and the second through hole 2222. That is equivalent to the first metal strip portion 221 connecting to a portion of the second metal strip portion 223 in parallel, which corresponds to that the impedance R1 connects to an impedance R21 and an impedance R23 in parallel in FIG. 5. Because the second the metal strip portion 223 is not completely contacted with the first metal strip portion 221. A portion of the second the metal strip portion 223 which is not contacted with the first metal strip portion 221 is equivalent to an impedance R22 in FIG. 5, that is, the impedance R21, the impedance R22, and the impedance R23 are the impedance of the second metal strip portion 223.

Here, it compares an equivalent circuit of the fan-out lead 22 and an equivalent circuit of the fan-out lead 12 in FIG. 2. It assumes that the upper and lower metal layers of the fan-out lead 12 in the prior art are respectively an impedance R1' and R2'. The equivalent circuit is that the impedance R1' is parallel to R2'. It can be known that R1' is greater than R1.

Figure 4:
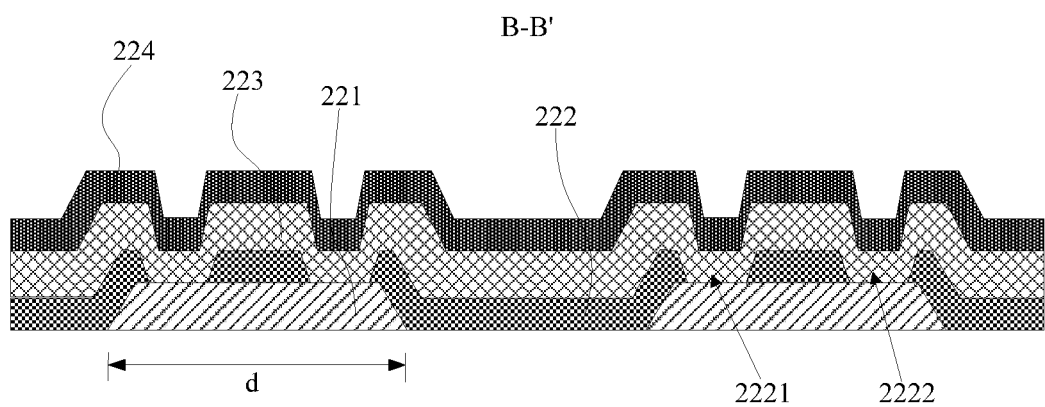
FIG. 4 is a cross-sectional view of the B-B' direction shown in FIG. 3.

In FIG. 4, because the length of the second metal strip 223 of the fan-out lead 22 is equal to the predetermined length L, the impedance R2 is very close to the impedance R2' such that it can assume R2=R2'=R21+R2+R23.

In FIG. 2, the equivalent impedance of the fan-out lead 12 is:

$$Ro'(R1'*R2')/(R1'+R2')=R2'/(1+R2'/R1')$$

Under the condition of equal length, a thickness of the second metal layer 123 is smaller than a thickness of the first metal layer 121 so that according to the impedance formula, $R=\rho l/S$, $R2' \geq R1'$, then $R_o' \leq R2'/2$.

The equivalent impedance of the fan-out lead 22 in FIG. 5 is:

$$Ro=(R1*R21)/(R1+R21)+R22+(R1*R23)/(R1+R23)=R21/(1+R21/R1)+R2\ 2+R23/(1+R23/R1).$$

If it adjusts the length d of the first metal strip portion 221 to be smaller than a certain value, the impedance R22 can be larger than R22 such that Ro can be larger than R22, that is, $R_o \geq R_o'$.

Therefore, under the condition of equal length, after adjusting the length d of the first metal strip portion 221, the impedance of the fan-out lead 92 is consistent with the impedance of the fan-out lead 12.

In addition, if the length d of the first metal strip portion 221 of the fan-out lead 22 is increased, the length of the second metal strip portion 223 which does not contact with the first metal strip portion 221 is reduced. That will cause the impedance R22 to be decreased so as to reduce the Ro. It also means that although the predetermined length of the fan-out leads 21 and 23 are greater than the predetermined length L of the fan-out lead 22. However, it can decrease the impedance of the fan-out leads 21 or 23 by increasing the length of the first metal strip portions of the fan-out leads 21, 23 in order to keep their impedances to be consistent with the impedance of the fan-out lead 22.

The array substrate of the embodiment of the present invention can keep the consistency of the impedance in the case of unequal length of the fan-out leads by adjusting the length of the first metal strip portions of the fan-out leads. By the above way, it does not require to perform winding process for the fan-out leads so as to decrease the height of the fan-out leads, increase the utilization of the array substrate, and be beneficial for the narrow frame design of the display panel.

The present invention also provides a flat panel display device, and the flat panel display device includes an array substrate described at the above embodiments. Other parts of the flat panel display device can refer to the prior art, and it is not described in detail here.

With reference to FIG. 6, it is a flowchart of manufacturing method for an array substrate according to the present invention. The manufacturing method comprises the following steps:

Step S31: forming a first metal layer on a glass substrate and manufacturing the first metal layer into multiple first metal lines distributed as a fan shape, wherein each of the first metal lines includes a first metal strip portion having a predetermined number, and each of the first metal strip portion is spaced apart; lengths of the first metal strip portions of the multiple first metal lines are increased along a direction which is from a center to an edge of the fan shape and the predetermined numbers are decreased along the direction.

Wherein, the first metal layer may be formed by deposition process. After the first metal layer is formed, it can manufacture the first metal layer into multiple first metal lines distributed as a fan shape by a wet etching process. Because each of the first metal lines comprises the first metal strip portion which have the predetermined number and is spaced apart so that the first metal lines are not continuous. The predetermined number of the first metal strip portion of each first metal line is different. If the length of the first metal strip portion is longer, the predetermined number is smaller.

In this embodiment, the length of each first metal strip portion of each first metal line is equal, and a distance between each of the first metal strip portion is equal.

Step S32: forming an insulation layer on the multiple first metal lines, a location of the insulation layer covering on each of the first metal strip portion forms with a first through hole and a second through hole.

Wherein, the insulation layer is formed by the coating process. After forming the insulation layer, utilizing a dry etching process to form a first through hole and a second through hole at the insulation layer.

Step S33: forming a second metal layer on the insulation layer and manufacturing the second metal layer into multiple second metal strip portions, wherein each of the second metal strip portions contacts with each of the first metal strip portion by the first through hole and the second through hole; a length of the second metal strip portion is greater than or equal to a length of the first metal strip portion.

Wherein, the second metal layer may also be formed by deposition process. After the second metal layer is formed, the second metal layer is manufactured into multiple second metal strip portions by a wet etching process. A line width of the second metal strip portions is equal to a line width of the insulation layer.

The length of the second metal strip portions is the length of the fan-out lead. The length of the first metal strip portion can equal to the length of the second metal strip portions, and the predetermined number of the first metal strip portion is one in this condition. Correspondingly, the first and second through holes are respectively one in number. That condition is equivalent to that the first metal strip portion and the second metal strip portion are connected in parallel.

After step S33, the manufacturing method may further include: forming a passivation layer on the multiple second metal strip portions. The passivation layer can protect the second metal strip portions.

Through the above way, the array substrate, the manufacturing method for the array substrate, and the flat panel display device of the present invention provides with a first through hole and a second through hole at a location of the insulation layer which covers each of the first metal strip portion such that the second metal strip portion contacts with each of first metal strip portion by the first through hole and the second through hole. By adjusting the length of the first metal strip portion of each fan-out lead, it can keep impendences of the fan-out leads to be consistent under the lengths of the fan-out leads are not equal so as to decrease the heights of the fan-out leads, increase the utilization of the array substrate, and be beneficial for the narrow frame design of the display panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An array substrate comprising
    an effective display region; and
    a non-effective display region surrounding the effective display region and having multiple fan-out leads distributed as a fan shape, wherein, each fan-out lead has a predetermined length, and the predetermined lengths of the multiple fan-out leads are increased along a direction which is from a center to an edge of the fan shape, wherein, any one of the fan-out leads comprises:
    a first metal strip portion having a predetermined number, wherein, the first metal strip portion having the predetermined number disposed along an extension direction of the fan-out lead and is spaced apart, and a length of each of the first metal strip portion is less than or equal to the predetermined length;
    an insulation layer covering each of the first metal strip portion, and a location of the insulation layer which is covering each of the first metal strip portion is disposed with a first through hole and a second through hole; and
    a second metal strip portion located on the insulation layer and being contacted with each of the first metal strip portion by the first through hole and the second through hole, wherein, a length of the second metal strip portion is equal to the predetermined length;
    wherein, the lengths of the first metal strip portions of the fan-out leads are gradually increased along the direction which is from the center to the edge of the fan shape and the predetermined numbers of the first metal strip portions are gradually decreased along the direction such that impedances of the fan-out leads are consistent; and
    wherein, the length of each of the first metal strip portion is equal.

2. The array substrate according to claim 1, wherein, any one of the fan-out leads comprises a passivation layer covering the second metal strip portion.

3. The array substrate according to claim 1, wherein, a distance between each of the first metal strip portion is equal.

4. The array substrate according to claim 1, wherein, a line width of each of the fan-out leads is equal.

5. A flat panel display device comprising an array substrate, wherein the array substrate comprises:
    an effective display region; and
    a non-effective display region surrounding the effective display region and having multiple fan-out leads distributed as a fan shape, wherein, each fan-out lead has a predetermined length, and the predetermined lengths of the multiple fan-out leads are increased along a direction which is from a center to an edge of the fan shape, wherein, any one of the fan-out leads comprises:
    a first metal strip portion having a predetermined number, wherein, the first metal strip portion having the predetermined number disposed along an extension direction of the fan-out lead and is spaced apart, and a length of each of the first metal strip portion is less than or equal to the predetermined length;
    an insulation layer covering each of the first metal strip portion, and a location of the insulation layer which is covering each of the first metal strip portion is disposed with a first through hole and a second through hole; and
    a second metal strip portion located on the insulation layer and being contacted with each of the first metal strip portion by the first through hole and the second through hole, wherein, a length of the second metal strip portion is equal to the predetermined length;
    wherein, the lengths of the first metal strip portions of the fan-out leads are gradually increased along the direction which is from the center to the edge of the fan shape and the predetermined numbers of the first metal strip portions are gradually decreased along the direction such that impedances of the fan-out leads are consistent; and
    wherein, the length of each of the first metal strip portion is equal.

6. The flat panel display device according to claim 5, wherein, any one of the fan-out leads comprises a passivation layer covering the second metal strip portion.

7. The flat panel display device according to claim 5, wherein, a distance between each of the first metal strip portion is equal.

8. The flat panel display device according to claim 5, wherein, a line width of each of the fan-out leads is equal.

* * * * *